(12) United States Patent
Aders et al.

(10) Patent No.: US 11,474,172 B1
(45) Date of Patent: Oct. 18, 2022

(54) PNEUMATIC CABLE SHUTTLE SYSTEM FOR 2FNMR

(71) Applicant: Bruker BioSpin GmbH, Ettlingen (DE)

(72) Inventors: Philipp Aders, Karlsruhe (DE); Andreas Tilch, Karlsruhe (DE); Thorsten Marquardsen, Karlsruhe (DE); Jean-Max Tyburn, Wissembourg (FR)

(*) Notice: Subject to any disclaimer, the term of this patent is extended or adjusted under 35 U.S.C. 154(b) by 0 days.

(21) Appl. No.: 17/715,299

(22) Filed: Apr. 7, 2022

(30) Foreign Application Priority Data

Apr. 8, 2021 (EP) .................................... 21167449

(51) Int. Cl.
| | |
|---|---|
| G01R 33/30 | (2006.01) |
| B25J 19/02 | (2006.01) |
| B25J 9/10 | (2006.01) |
| G01R 33/46 | (2006.01) |

(52) U.S. Cl.
CPC .......... *G01R 33/307* (2013.01); *B25J 9/1045* (2013.01); *B25J 19/021* (2013.01); *G01R 33/46* (2013.01)

(58) Field of Classification Search
CPC ...... G01R 33/307; G01R 33/46; B25J 9/1045; B25J 19/021
See application file for complete search history.

(56) References Cited

U.S. PATENT DOCUMENTS

| | | | |
|---|---|---|---|
| 4,859,949 A | 8/1989 | McKenna | |
| 9,696,391 B2 | 7/2017 | Tai-Huang et al. | |
| 2013/0342209 A1* | 12/2013 | Huang | G01R 33/445 324/321 |

(Continued)

FOREIGN PATENT DOCUMENTS

| | | |
|---|---|---|
| EP | 2610631 B1 | 10/2015 |
| EP | 3081954 B1 | 10/2016 |
| WO | 2019089961 A1 | 5/2019 |

OTHER PUBLICATIONS

Hall, Andrew M.R. et al, "A temperature-controlled sample shuttle for field-cycling NMR", Journal of Magnetic Resonance 317 (2020).

(Continued)

*Primary Examiner* — Jay Patidar
(74) *Attorney, Agent, or Firm* — Benoit & Côté Inc.

(57) ABSTRACT

A transfer device is provided for shuttling an NMR sample container between at least two coaxially arranged NMR magnet systems of an NMR spectrometer comprising a guide tube positioned in a central bore of the magnet systems, a shuttle assembly arranged inside the guide tube for securely holding and shuttling the sample container and a drive system comprising a pulling drive and a winch cord attached to the drive system on one side and to the shuttle assembly on the other side, such that the shuttle assembly can travel inside the guide tube. The transfer device has a pneumatic pressurizing arrangement with an entry for pressurized gas arranged on a gas-tight body above the shuttle assembly that is adapted to maintain the winch cord under (Continued)

tension. The shuttle assembly comprises a piston design being moveable along the common axis of the coaxial magnet systems under the influence of the pressure.

15 Claims, 6 Drawing Sheets

(56) References Cited

U.S. PATENT DOCUMENTS

| | | | |
|---|---|---|---|
| 2015/0204952 A1* | 7/2015 | Schett | G01R 33/307 324/321 |
| 2020/0150199 A1* | 5/2020 | De Vries | G01R 33/307 |

OTHER PUBLICATIONS

Ching-Yu, Chou et al. "A compact high-speed mechanical sample shuttle for field-dependent high-resolution solution NMR", Journal of Magnetic Resonance 214 (2011).

Redfield. Alfred G., "Shuttling device for high-resolution measurements of relaxation and related phenomena in solution at low field, using a shared commercial 500 MHz NMR instrument", Magn. Reson. Chem. 2003; 41: 753-768.

Redfield. Alfred G., "High-resolution NMR field-cycling device for full-range relaxation and structural studies of biopolymers on a shared commercial instrument", J. Biomol NMR (2012) 52:159-177.

* cited by examiner

PNEUMATIC CABLE SHUTTLE SYSTEM FOR 2FNMR

BACKGROUND OF THE INVENTION

Field of the Invention

This invention relates to a nuclear magnetic resonance ("NMR") spectrometer adapted for performing field-cycling techniques including two-field NMR ("2F-NMR"), with at least two coaxially arranged NMR magnet systems generating different magnetic fields and with a transfer device for shuttling an NMR sample container between the NMR magnet systems, the transfer device comprising a guide tube positioned in a central bore of the coaxial magnet systems, a shuttle assembly being arranged inside the guide tube for securely holding and shuttling the NMR sample container and a drive system comprising a pulling drive and a winch cord being attached to the drive system on one side and to the shuttle assembly on the other side, such that the shuttle assembly can travel inside the guide tube between the coaxial magnet systems.

Description of the Related Art

A temperature-controlled sample shuttle for field-cycling NMR is known from a scientific article by Andrew M. R. Hall et al, "A temperature-controlled sample shuttle for field-cycling NMR", Journal of Magnetic Resonance 317 (2020).

In general, the present invention relates to the technical field of magnetic resonance. NMR spectroscopy is a powerful tool in instrumental chemical analysis and a commercially widespread method for analyzing and characterizing the chemical composition of substances. In NMR experiments, a sample is exposed to a strong static magnetic field, which interacts with spins of nuclei contained in the sample. Radio frequency ("RF") pulses are sent into the sample for manipulating the spins, and the sample's reaction, i.e., RF signals (also called "NMR signals") are measured. The sample's reaction depends on the environment of the nuclei in the sample, in particular bonding electrons. Accordingly, information about the chemical structure of the sample can be obtained by analyzing the NMR signals measured.

Improvements of NMR methods like field-cycling allow exploiting interaction of nuclear spins with magnetic fields of different strengths, by means of which more spectroscopic information about the sample becomes accessible. Field-cycling techniques in NMR have been applied on various field dependent studies. The main idea is to measure the relaxation in the frequency basis. Its applications include material science, such as polymer dynamics, and structural biology, such as membrane dynamics and protein dynamics, and relaxation measurements on contrast agent in MRI field, etc.

In particular, in 2F-NMR experiments, nuclear spins may be exposed to and manipulated by means of RF pulses at two different magnetic field strengths. This allows obtaining additional spectroscopic information about the sample, in particular dynamic information or an additional measurement dimension, which may be used to increase resolution, in particular to identify maxima in spectra more reliably.

At a first working volume equipped with the first NMR probe, a first field strength ("high field") with a high homogeneity is present, allowing in particular a strong initial polarization and a signal detection with high resolution and high sensitivity. Further, nuclear spin manipulations may be done at the first working volume. At a second working volume equipped with the second NMR probe, a second field strength ("low field") with an at least fairly good homogeneity is present, which also allows nuclear spin manipulations, in particular band-selective manipulations of spins.

For numerous nuclear spin systems, the coupling properties and/or the relaxation times depend on the magnetic field strength present. Accordingly, since there are two different field strengths available, a 2F-NMR apparatus may perform experiments, which make use of the different coupling properties and/or relaxation times in the same single measurement.

This provides additional information about the sample in spectroscopy applications. In particular, dynamic information (movement information) about nuclei in the sample or molecules containing said nuclei may be obtained.

Thus, an additional dimension of NMR measurement of the sample becomes available. This additional dimension is based on a different second field strength and therefore on a different physical behavior, as compared to the physical behavior at the first field strength. In other words, the development of a spin system in the sample is different at the first and second field strength.

EP 3 081 954 B1 describes 2F-NMR measurements involving a sample in a first working volume of a highly homogeneous magnetic field with a first field strength and transferring the sample to a second working volume with a magnetic field having lower homogeneity at a second field strength. A sample carrier is provided for transporting the sample between the first working volume and the second working volume by means of a device for transporting the sample comprising a straight tubular guide in which the sample carrier may move, and further two pieces of auxiliary tubing for applying gas pressure at the opposing ends of the tubular guide. By means of pressure differences between the ends of the tubular guide, the sample carrier may be accelerated within the tubular guide. The gas pressure is controlled via shuttle controller. By means of position sensors, an arrival of the sample carrier at a desired working volume may be verified.

A scientific article by Alfred G. Redfield ("Shuttling device for high-resolution measurements of relaxation and related phenomena in solution at low field, using a shared commercial 500 MHz NMR instrument" Magn. Reson. Chem. 2003; 41: 753-768) discloses an apparatus usable in unmodified spectrometer and probe without much modification. A pneumatic glass shuttle tube, 22 mm inside diameter, held in an aluminum support tube, is temporarily inserted in place of the upper tube that is supplied by the manufacturer to be inserted into the top of the magnet. A standard thin-walled NMR tube is connected to a plastic piston shuttle that is moved up or down inside the shuttle tube, by low vacuum or pressure applied from the top. A shock absorber is attached to the bottom end of the stop tube, to stop the sample's upward travel at a point where the field has the desired value for the relaxation determination, and an identical shock absorber is built into the top of the shuttle tube bottom mount. When a sample has to be removed to be replaced by another, or in preparation for removing the apparatus from the spectrometer, the stop tube is removed, and the shuttle, with the attached sample tube, is sucked up to the top with a simple vacuum fitting (not shown). The low value of magnetic field, where the relaxation process measured occurs, is determined by a movable mechanical stop whose position is changed manually between runs. The downward path is initiated by a short higher-pressure pulse, followed by a long lower pressure interval. The round-trip time limit is about 0.2 s, suitable for relaxation rate measurements in the range up to about 10 s$^{-1}$.

A later article by Alfred G. Redfield ("High-resolution NMR field-cycling device for full-range relaxation and structural studies of biopolymers on a shared commercial instrument" J. Biomol NMR (2012) 52:159-177) describes a shuttle device for NMR spectrometers. The shuttler installed on top of the 500 MHz commercial instrument at Brandies University. The top of one of the four vertical legs of the shuttler support frame is visible in front. The frame of the linear motor is C-clamped to one of the top rails of the frame. Directly between the two timing belts is the extender, containing the short upper section of the glass shuttle tube. Passing through the hula bearing from the bottom, a short section of the push rod is visible, connected at its top to the black plastic cross-piece, which is clamped to the two timing belts. The linear motor assembly is based on a servomotor and shaft driving two timing-belt pulleys that drive two side-by side timing belts, which in turn pass over two smaller upper pulleys about 1.4 m above the motor shaft (not visible). The plastic cross-piece is clamped onto and between the two belts, and the rotary motor is programmed by the microprocessor to move it at high speed, up to 10 m/s. The bottom section of the vertical post, that supports the upper pulleys nearly 1.3 m above, is visible behind the nearest timing belt. The upper of the two Helmholtz coils is visible just below the two rails, covered with white plastic, that support the linear motor assembly.

U.S. Pat. No. 9,696,391 B2 discloses a shuttle device to shuttle an NMR sample from a first high field volume to a second volume. The shuttling device includes: (i) A motor assembly, which is fixed on the horizontal mounting board and (ii) a guiding rail assembly attached to the motor assembly from below of a horizontal mounting board. The shuttle carries the sample tube to slide up or down along the designated path on a guiding rail assembly. This shuttling apparatus, when in use, is mounted on top of a superconducting magnet, by resting the horizontal mounting board on top of the magnet. The guiding rail assembly, the shuttle and the sample are all inside of the magnet bore.

EP 2 610 631 B1 describes a device and a method for dynamic nuclear polarization ("DNP") enhanced NMR. The device comprises a high field superconductive polarization magnet inside a cryostat and an auxiliary low field magnet, which is located above the polarization magnet and has variable field strength, which can be regulated from 0 mT up to 10 mT or more. A movable sample positioning device with attached sample holder is used to position the sample inside the cryostat by means for instance of a pneumatic actuator or electro-mechanical drive (not shown) for polarization of the nuclear spins.

U.S. Pat. No. 4,859,949 A describes a transport mechanism for samples in a clinical NMR spectrometer. A sample holder including a plurality of bores is located vertically through the holder. Further included within each bore is a ram guide channel, which maintains alignment of a ram in the approximate center of each bore. The support surface includes an opening formed therethrough in alignment with the central bore. The opening is part of an extended channel, which maintains the ram in alignment with the central bore. The ram includes a rigid portion and a flexible portion. The flexible drive band is typically a plastic band having compressive strength for supporting the rigid ram and dimensioned to maintain the width of the rigid ram at the limit created by lateral ribs. The other end of the drive band is affixed to a drive wheel, which is rotated for controlling movement and position of the entire ram. The angular position of the drive wheel is controlled by means of a drive belt and a stepper motor.

Hall et al., cited above, describes in its chapter 3 a shuttle system comprising a cord drive system with a winch and a stepper motor to move a sample shuttle between variable magnetic fields. The shuttle is guided inside a guide tube. A counter pressure, which keeps the cord under tension, is not provided and hence a high-speed transfer of the shuttle is not possible in this known system.

SUMMARY OF THE INVENTION

An NMR sample tube should oscillate in the shortest possible time between two spatially separated magnetic fields of different field strengths to enable relaxometry and 2F-NMR measurements. The technical challenge is to develop a compact mechanism which can be integrated into an NMR spectrometer and which is able to move the sample container precisely in milliseconds at high speed without negatively affecting the measurement by shocks, vibrations, heat input or contamination by foreign objects.

In 2F-NMR experiments, two magnets are placed on top of each other and the sample container oscillates between their respective magnetic centers. The sample tube is immersed in the lower (HighField) probe head, while its so-called "shuttle" (slide in the linear guide) comes to a standstill above the probe head. For excitation in the upper (low-field) probe head, the shuttle first passes through a controlled field area before the sample tube reaches its low field measurement position.

In order to achieve the highest possible filling factor, the linear guide must not take up more radial installation space than the sample container and the materials used must not impair the measurement. In order for the device to be set up in common laboratories, the room height must be taken into account during construction, which means that the shuttle system, when installed, may only slightly increase the total height of the spectrometer.

Taking this into consideration, the present invention provides a compact shuttle system, which can easily be integrated in an NMR spectrometer in a space-saving manner and which allows to oscillate the NMR sample container within a very short time period of less than 100 ms very precisely between two adjustable or selectable measuring positions of different magnetic field strengths in order to allow for relaxometric and 2F-NMR measurements without negatively affecting or impairing the measurements by mechanical shocks, vibrations, heat input or contamination by debris or other foreign matter, in particular during standstill phases.

The invention uses a transfer device which can be integrated in a 2F-NMR spectrometer as described above, the transfer device comprising a pneumatic pressurizing arrangement with an entry for pressurized gas arranged on a gas-tight body above the shuttle assembly being adapted to maintain the winch cord under tension, whereby the shuttle assembly comprises a piston design charged with pressure and being moveable along the common axis of the coaxial magnet systems under the influence of the gas pressure.

The transfer system according to the invention can easily be integrated into a commercial NMR spectrometer in a space-saving manner and is capable of moving an NMR sample container, which is fastened to the shuttle assembly, precisely between at least two adjustable measuring positions in less than 100 ms.

In particular, the presented transfer system with the shuttle assembly allows an NMR sample container to move rapidly in a couple of milliseconds between two positions at a distance of about 1 m or even more for high field NMR magnets having a longer central bore and thus a longer distance to the low field magnet positioned above. The filling factor inside the magnet bore is very low as it only uses a guide tube made of a nonmagnetic material such as glass having an inner diameter, which corresponds to the shuttle assembly plus the surrounding air gap. The whole kinematic structure is localized inside the guide tube of 3 mm to 15 mm in diameter.

The number of pieces and the geometry is minimalized, as it requires only a cable (preferably made of nylon) and a tube. The state-of-the-art solutions are each more space demanding.

The cable winch and the changing station, which are arranged above the NMR-magnet, have a compact geometry such that it implicates generally no inconvenience for an installation in laboratory rooms with a standard ceiling height.

The system can be adapted to existing or commercially available NMR spectrometers without any modification in the magnet bore.

The 2F-NMR spectrometer has at least two coaxially arranged NMR magnet systems. For relaxometry, the second spot is not adapted for high resolution whereas the first spot in 2F-NMR is. The second magnetic spot can be, e.g., a ferromagnetic-shim, a magnetic tunnel, a permanent magnet, a cryo-magnet or a suitable electro-magnet.

The winch cord is permanently maintained under tension in each operating phase of the spectrometer, and it should not slack off for proper functionality. For example, the shuttle can be held in an uppermost position with a resilient means to be maintained under tension in the changing station even when the gas supply is turned off.

In straightforward embodiments of the invention, the shuttle assembly is designed as being moveable in linear directions along the common axis of the coaxial magnet systems.

In certain beneficial embodiments of the invention, an air gap is provided between the shuttle piston and the inner wall of the guide tube. The airgap provides an gas cushion for the shuttle for a quicker movement inside the guide tube without any friction.

The filling factor inside the magnet bore is very low as it only uses a glass tube having an inner diameter, which corresponds to the shuttle piston design plus the surrounding air gap. Under these conditions, especially for the low field probe in 2-field NMR, the filling coefficient of the RF coil for transmission and reception is maximized. The useful RF power is reduced whilst increasing the sensitivity at low fields.

The air gap may range from 10 µm and 50 µm. Depending on the applied gas pressure, the air gap allows the passage of gas, which is preferably adjusted to a chosen temperature for the sample. The gas flow through the air gap amounts to at least 5 l/min, preferably at least 10 l/min. The tempered gas stream flows through the air gap between the guide tube and the shuttle piston design and reaches the NMR sample container. The sample container can take over the temperature of the gas stream. In NMR applications, a constant, stable and accurate temperature is required, regardless of the field plate in which the measurement is made. In this particular case of relaxometry NMR or 2FNMR, these conditions are reached and there will be no influence on the temperature at high field.

In another advantageous embodiment, the pulling drive of the drive system is equipped with a rotating mechanism, preferably driven by a servo motor or a stepper motor. The rotating mechanism allows a compact embodiment of the drive system. A cable winch can be designed to fit above an NMR spectrometer not protruding too much beyond the spectrometer.

Stepper motors or servo motors can accelerate quickly and in particular, these motors are adjustable to a certain number of steps. The position of the sample in the guide tube is well known because each of the sample positions in the sample tube corresponds to a position of the stepper motor, so the number of steps is determined before use. The obtained positioning is better than 0.1 mm. The Z position of the sample corresponds to a stepper motor encoding.

In a preferred further development of this embodiment, the servo motor or stepper motor is calibrated for the number of steps being performed between two measuring positions within the NMR magnet systems, the distance between the upper and the lower measuring position being recorded by determining the appropriate number of steps. The positioning in the measuring magnetic field for relaxometry or 2FNMR is then accurate.

A preferred embodiment of the invention is characterized in that the pulling drive comprises a cable winch. As mentioned above, the cable winch allows a compact design. Often the spectrometers are high extending up to the laboratory ceiling, so a compact design is necessary. The main advantage is a silent solution that limits the risk of wear and tear and limits the diffusion of friction residue in the NMR measuring chambers.

It is conceivable to use a swinging arm, an independent axle or a cam instead of a cable winch, but they are less preferred.

In an advantageous embodiment, an end stop being vibration damping in high field position comprises an abutment surface between the shuttle and a protrusion at the end of the guide tube. The damping helps to cushion the hard stop so that the NMR sample tube (container) does not detach or displace from the shuttle assembly. It is also a double check of the correct positioning of the sample in the high-resolution probe.

Preferably, the abutment surface is chamfered. The chamfer allows the centralizing of the shuttle assembly with the NMR sample container inside the field of view of the spectrometer.

The guide tube and the drive system may be mounted together to form an essentially gas-tight body. It might, however, be easier, not to pressurize the drive system. So, in simpler embodiments, there is just a small gas stream arranged from the changing station to the drive system to exhaust gas via the drive system to avoid any heating of the pressurized gas by the motor.

A further advantageous embodiment uses a gas-tight exchange station comprising a movable sleeve or a door, and provides the guide tube or an extension of the guide tube with an opening to access the shuttle assembly and the NMR sample container.

In another embodiment, the guide tube ends in front of the changing station and the shuttle assembly abuts a movable weight element which is pulled to an upper resilient stop. The weight element is engaged with a guide rail which is helpful to reinsert the NMR sample container into the guide tube when the cord is lowered.

Thus, an easy exchange of the sample container is facilitated. The exchange station can have a means to depressurize the chamber or to shut the pressurized gas supply before opening the exchange station by moving the sleeve or opening the door. This solution allows a fast sample exchange. It also may permit the use of a sample changer robot.

In any case, it is desirable to use the driven pressurized gas for tempering the sample at the same time. Additionally or supplementary, it is possible to use a partly permeable shuttle piston in order to direct tempering gas to the sample region.

The guide tube is not necessarily designed integrally, uniformly and/or one-pieced. In embodiments of the invention, the opening of the tube can as well be a separate part.

A particular class of embodiments is characterized in that a detector element is arranged to measure the exact position of the shuttle assembly in the magnetic fields. Said detector element is arranged to measure the exact position of the shuttle to ensure that the sample tube is precisely positioned in the homogenous B0' field in the lower position and in the high B0" position for 2F-NMR. The detector element can be connected by an interface to the operating software. This makes it possible to measure very quickly when the shuttle is in the measurement position and the software can trigger the measurement immediately.

In this class of embodiments, the detector element may comprise a light barrier transmitting light through the guide tube, when the shuttle piston is in its lower position in the high B0 field and the high position B0" field for 2F-NMR.

Another embodiment of the invention provides that the guide tube is made of nonmagnetic material. This is essential for not disturbing the magnetic field, neither in its saturation nor in its homogeneity.

In an advantageous further development of the transfer device, the guide tube is radially fixed by bumper fastenings or dampening brackets that constraint the maximum radial vibration amplitude to less than air gap dimension. This has also been proven for effectively reducing the abrasion of the shuttle assembly.

In a further embodiment, the winch cord comprises a cord, a wire or a rope. The cord should not be flexible or elastic so that the cord responds directly to the acceleration/deceleration. Otherwise, the cycle time will be longer. Nylon is a suitable material for this purpose.

The winch cord is aligned in the center of the guide tube by a centering device, which is arranged on the upper end of the guide tube. The centering device can be combined with the weight device of the exchange station. The centering device is preferably designed with several through holes for allowing an easy flow of the pressurized gas into the guide tube and a center hole through which the winch cord is guided.

With the help of the centering device, the induced vibrations in the guide tube are significantly reduced. In addition, the abrasion on the shuttle assembly is significantly reduced due to the fact that the shuttle is better centered.

In certain embodiments of the invention, the diameter of the guide tube ranges from 3 mm to 15 mm. If the diameter is too big, the torque of the motor needs to increase a lot and the shuttling speed of the shuttle assembly will be decreased due to the mass of the NMR sample container and the force of the pressurized gas on the shuttle assembly. It is even possible to use the invention very small NMR sample tubes of 3 mm diameter.

The present invention also comprises an NMR spectrometer adapted for performing field-cycling techniques including 2F-NMR, with at least two coaxially arranged NMR magnet systems for generating different magnetic fields comprising a transfer device with a shuttle assembly as described above. The NMR spectrometers known in the art are not suitable for two-field NMR measurements as the transfer between the magnet systems is generally not fast enough compared to the quick relaxation time of the spins of the nuclei.

Further advantages can be extracted from the description and the drawings. The features mentioned above and below can be used in accordance with the invention either individually or collectively in any combination. The embodiments mentioned are not to be understood as exhaustive enumeration but rather have exemplary character for the description of the invention.

BRIEF DESCRIPTION OF THE DRAWINGS

The invention is shown in the drawing and is explained in more detail on the basis of illustrative embodiments.

DETAILED DESCRIPTION

Figure 1:
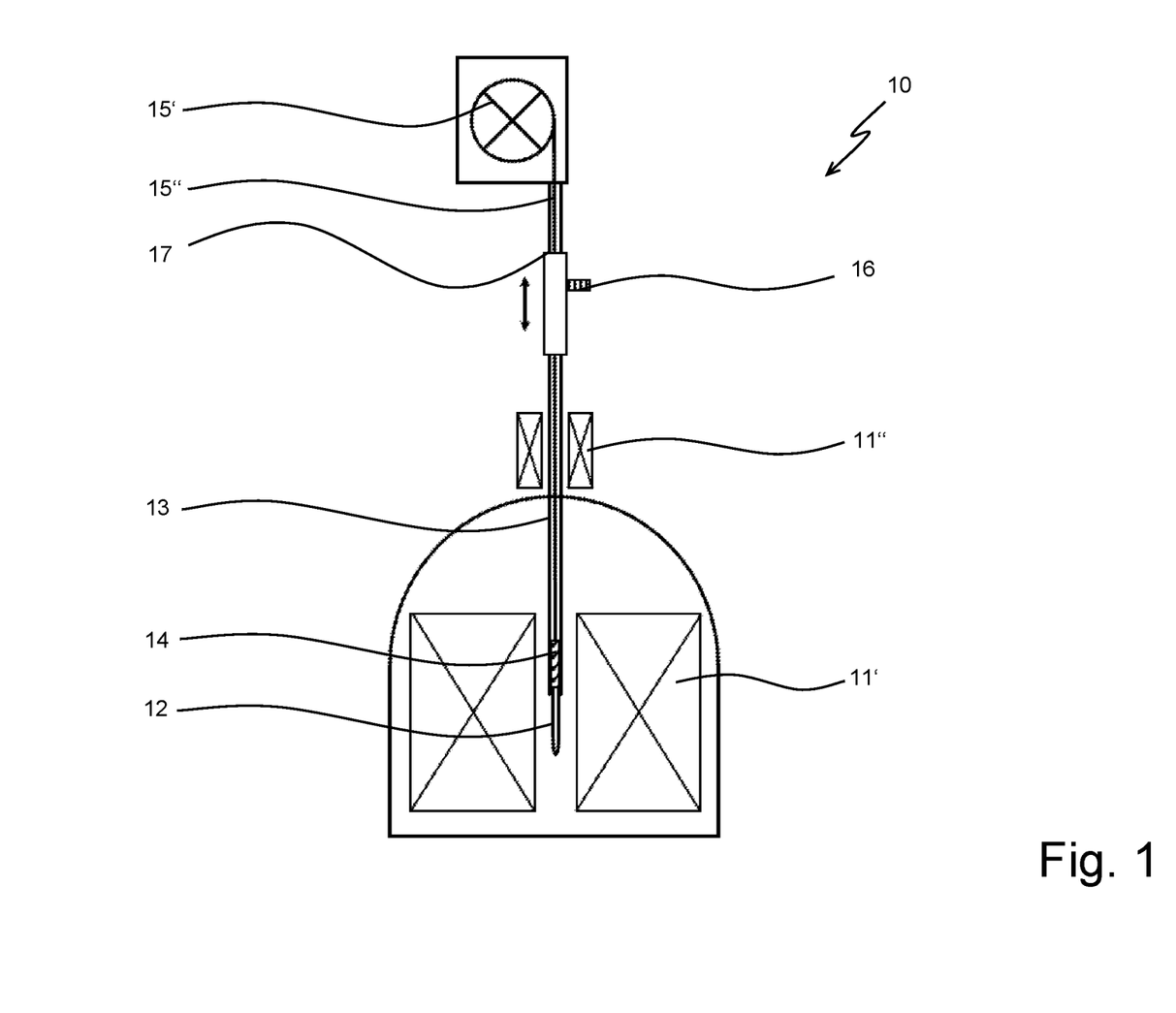
FIG. 1 shows a schematic vertical cross section through an NMR spectrometer with a transfer device according to the invention.

FIG. 1 schematically depicts a transfer device for shuttling an NMR sample container 12 between at least two coaxially arranged NMR magnet systems 11'; 11" of an NMR spectrometer 10, in particular a high-field NMR magnet system 11' and a low-field NMR magnet system 11". The transfer device comprises a guide tube 13 positioned in a central bore of the coaxial magnet systems 11'; 11", a shuttle assembly 14 being arranged inside the guide tube 13 for securely holding and shuttling the NMR sample container 12 and a drive system comprising a pulling drive 15' and a winch cord 15" being attached to the drive system on one side and to the shuttle assembly 14 on the other side, such that the shuttle assembly 14 can travel inside the guide tube 13 between the coaxial magnet systems 11'; 11".

The pulling drive 15' of the drive system may comprise a cable winch, which is equipped with a rotating mechanism. The rotating mechanism can be driven by a servo motor or a stepper motor (not shown in the drawings). The servo motor or stepper motor can be calibrated for the number of steps being performed between two measuring positions within the NMR magnet systems 11'; 11", the distance between the upper and the lower measuring position being recorded by determining the appropriate number of steps.

The transfer device according to the invention is characterized by a pneumatic pressurizing arrangement with an entry 16 for pressurized gas arranged on a gas-tight body 17 above the shuttle assembly 14 being adapted to maintain the winch cord 15" under tension, and by a shuttle assembly 14 comprising a piston design being moveable along the common axis of the coaxial magnet systems 11'; 11" under the influence of the pressure.

Figure 2:
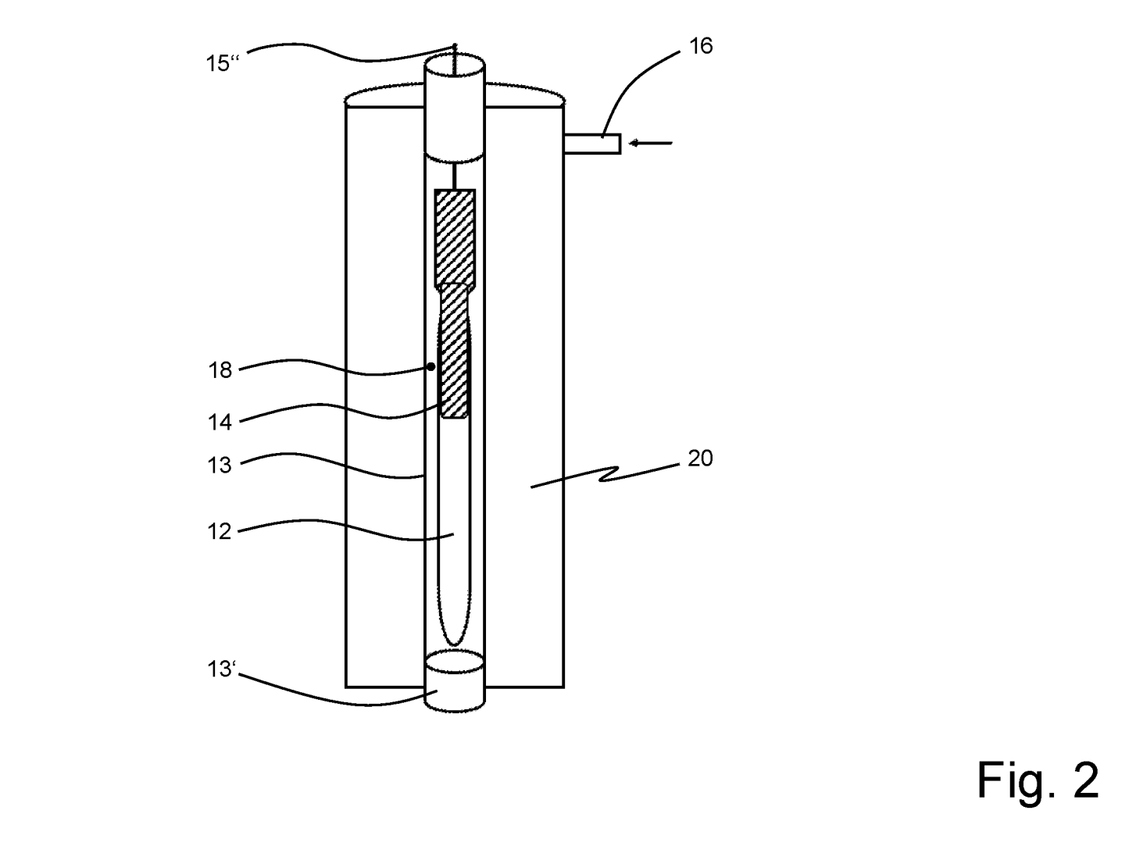
FIG. 2 shows a schematic cut-away view of an embodiment of the exchange station in a transfer device according to the invention.
Figure 3:
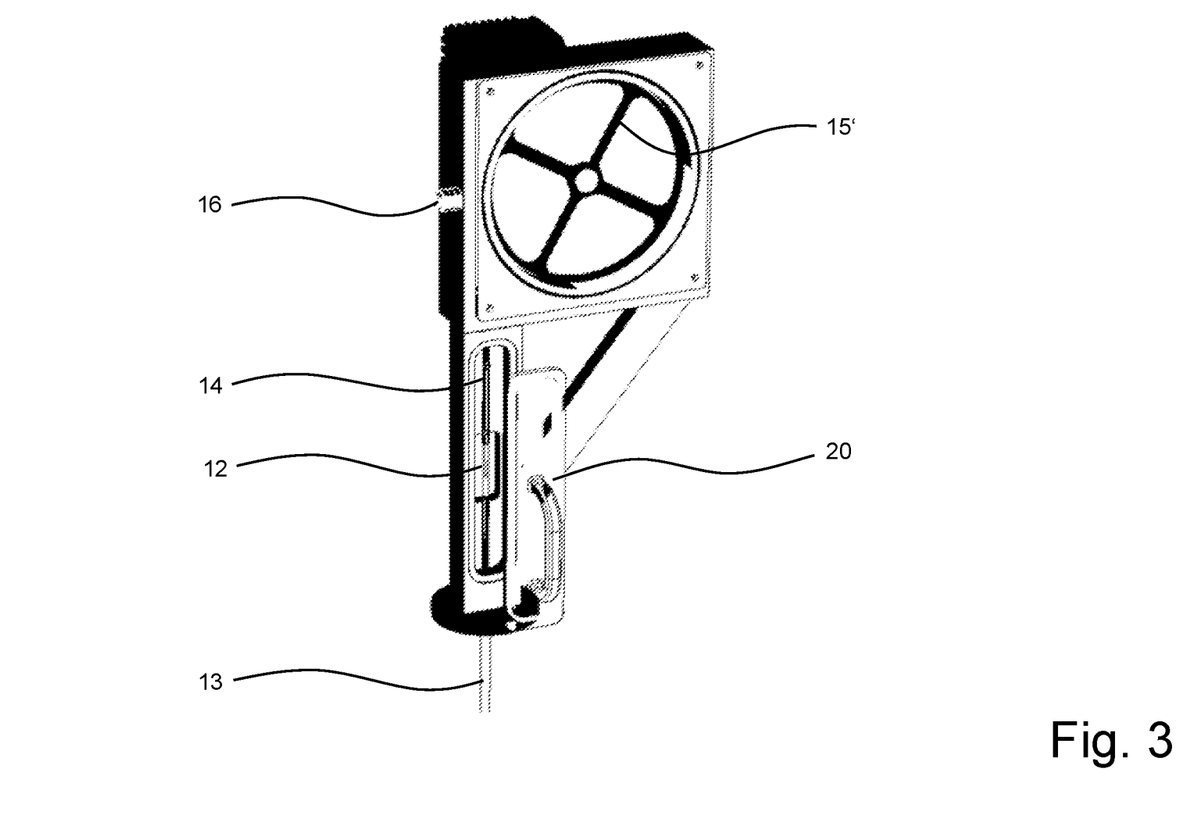
FIG. 3 shows in a stereoscopic partial view an embodiment of the transfer device according to the invention with a gas-tight exchange station and a shuttle assembly therein.

In FIG. 1, the whole shuttle assembly 14 with the guide tube 13 and a drive mechanism is shown schematically being implemented in a two-field NMR device. The shuttle is attached by the winch cord 15" and it can be moved between a high field position, a low field position and a changing position where the shuttle is located inside a gas-tight exchange station 20, as shown in FIGS. 2 and 3. Pressurized gas is fed via the changing station to keep the winch cord under tension.

The shuttle assembly 14 comprises a piston fitting into the guide tube 13 with an outer circumference so that it can move in it without friction. The friction between the shuttle and the guide tube is reduced by the fact that the compressed air can flow circumferentially past the shuttle, thus creating an air cushion between the guide tube 13 and the central bore of the coaxial magnet systems 11'; 11". In the present design, the distance to the wall of the guide tube is only 10 to 50 µm so that a flow of approximately 10 standard liters per minute is created between the wall of the guide tube 13 and the shuttle when a pressure of 3 to 6 bar is applied.

This gas flow is used in preferred embodiments to temper the sample in the sample container 12. The gas is therefore preset to a desired temperature.

As shown in the schematic cut-away view of FIG. 2 depicting the gas-tight exchange station 20 being part of the transfer device according to the invention, an air gap 18 is provided between the shuttle piston 14 and the inner wall of the guide tube 13. The air gap 18 may range from 10 µm and 50 µm.

Preferably, the pressure gas connection with the entry 16 is located at the non-movable component of the exchange station 20, whereby the gas flow can also be opened and closed there, either manually with a gas cock, or with a mechanically releasable shutter valve.

Usually, the guide tube 13 is made of glass. As indicated in FIG. 2, the guide tube 13 in its lower part may comprise a drilled hole 13' in a cylindrical aluminum component that also can contain a gas inlet.

FIG. 3 shows an embodiment of the transfer device according to the invention with the pulling drive 15' of the drive system in the shape of a cable winch, the exchange station 20 and the shuttle assembly 14 therein. Being integrated into an NMR spectrometer 10 in a space-saving manner, the transfer device is capable of moving an NMR sample tube 12, which is fastened to the shuttle, precisely between at least two adjustable measuring positions in less than 100 ms.

The basic idea was to design the shuttle as a pneumatic piston, which is guided in a tube made of dielectric material, so that it is pushed down with compressed air with the movement being controlled by a cable winch. As alternative embodiments (not shown here), a swing-arm or a cam can be used instead of a winch. The winch cord 15" is always kept under tension by the constantly applied gas pressure, allowing the shuttle to be precisely positioned with the pulling drive 15'. Since the moving parts have relatively low masses, significantly higher accelerations and speeds can be achieved than with belt-driven or rail-guided systems. Due to the central introduction of force by the cord pull or compressed air, no bearing forces are generated, so the system is subject to little wear and thus has a long service life. The shuttle is designed to fit in the tube with a narrow gap between the shuttle and the guide tube 13 thus allowing the formation of an air bearing or air cushion. The airflow between the shuttle/NMR-tube and the wall of the guide tube 13 is well calibrated and it can be used for tempering the sample.

The presented shuttle system allows a sample container 12 to move rapidly in a couple of milliseconds between two positions. The filling factor inside the magnet bore is very low as it only uses a glass tube having an inner diameter which corresponds to the sample container 12 plus the surrounding air gap 18. The whole kinematic structure is localized inside the guide tube 13 of about 10 mm in diameter.

The number of pieces and the geometry is minimized as it requires only a (nylon) cable and a tube. The state-of-the-art solutions are more space demanding.

The pulling drive 15' and the changing station 20, which are arranged above the magnet systems 11'; 11", have a compact geometry such that there is generally no inconvenience for an installation in laboratories with a standard ceiling height.

The system can easily be adapted to existing NMR spectrometers without any modification in the magnet bore.

Preferably, the NMR sample container 12 is maintained by the shuttle by force fitting elements such as a series of O-rings, which are positioned in a gap of the shuttle. The shuttle is designed to fit into the opening of a sample container 12. The friction force between the shuttle and the sample container 12 surfaces are designed to be sufficient for the high acceleration and deceleration of the sample container 12.

The piston is guided and sealed by a high-precision borosilicate glass tube which runs from the changing station (air lock) on the magnet to just above the high-field sample head in the magnet, where it ends in a centering end stop. Especially for use in 2F-NMR, the use of a quartz glass tube as a guide element is advantageous compared to a conventional linear slide, since its symmetrical geometry and material have a comparatively small effect on the measurement in the upper (low-field) sample head.

The shuttle is adapted to move in the guide tube 13 between an upper (low field) and a lower (high field) measuring position. For that the connection to the pressurized air or gas is arranged above the piston in its upper position and arranged such that the cord which is attached to the shuttle is kept under tension. For sealing effectiveness, the transfer device comprises pressurized system components with sealing carried out on the drive shaft. The connection to the pressurized gas is either at the gas tight cable winch or at the changing station 20. The advantage of these gas entry arrangements is that the box of the cable winch and the changing station 20 serves as a gas chamber providing a reservoir of pressurized gas which limits variations in pressure and gas temperature (buffer volume).

However, the motor can produce heat which could change the gas temperature. So, the entry via the box of the cable winch is less preferred.

The changing station 20 is arranged between the guide tube 13 and the pulling drive 15', above the upper measuring position. To change the sample container 12, the changing station 20 is depressurized, e.g., by closing a valve for gas inlet, and the shuttle is driven to an uppermost position. In this position, the changing station can be opened by the user to change the NMR sample container 12. In a preferred embodiment, the changing station 20 is surrounded by a generally cylindrical jacket, which is movable from a first position in which the changing station is closed and gas tight, to a second position in which the changing station is open and the shuttle with the sample container 12 is accessible to the user such that the sample container 12 can be changed. The shuttle exchange is executed in an unpressurized condition with the cable/rope pretension being provided by a spring-loaded mechanism.

The system is supplied with pressurized gas (e.g., compressed air connection 6 bar, even better: nitrogen) and with power from the socket (220V). The motor control preferably of a servo motor communicates with the spectrometer software ("TopSpin") via a data interface (e.g., CAN-Bus, Ethernet, USB). The software connection and the motor control correspond to the state of the art and comparable systems are used to control belt-driven shuttle systems.

In some embodiments, the pressurized gas is heated or cooled to the desired measurement temperature. In this way the sample temperature can be adjusted by using leaking piston drive gas flow. To make the tempering more efficient, the piston can be provided with through holes, thus increasing the gas flow around the NMR sample container 12.

Figure 4A:
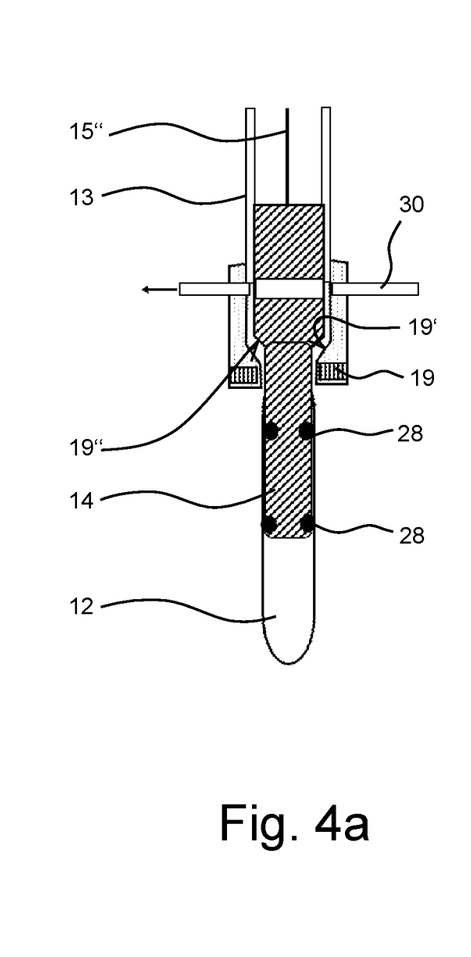
FIG. 4a shows a first schematic vertical cross section through an embodiment of the transfer device according to the invention with a detector element and end stop facilities for the shuttle assembly.
Figure 4B:
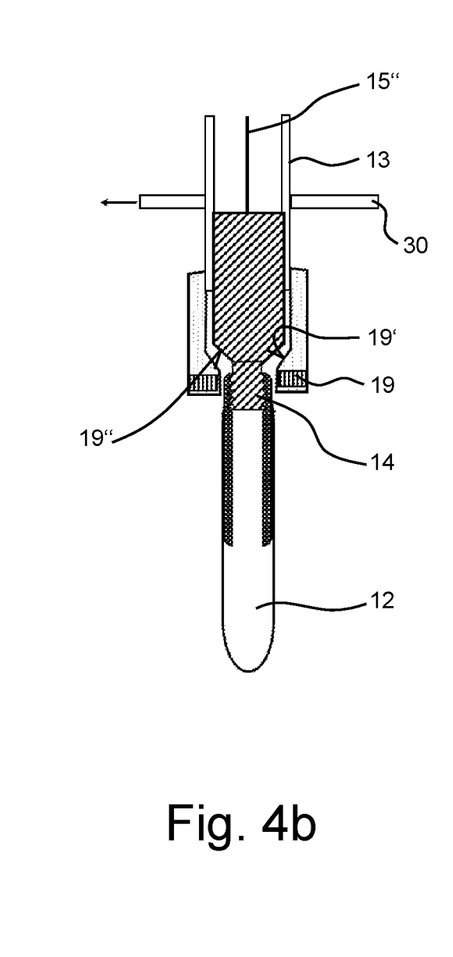
FIG. 4b shows a second schematic vertical cross section through an embodiment of the transfer device according to the invention with a detector element and end stop facilities for the shuttle assembly.
Figure 4C:
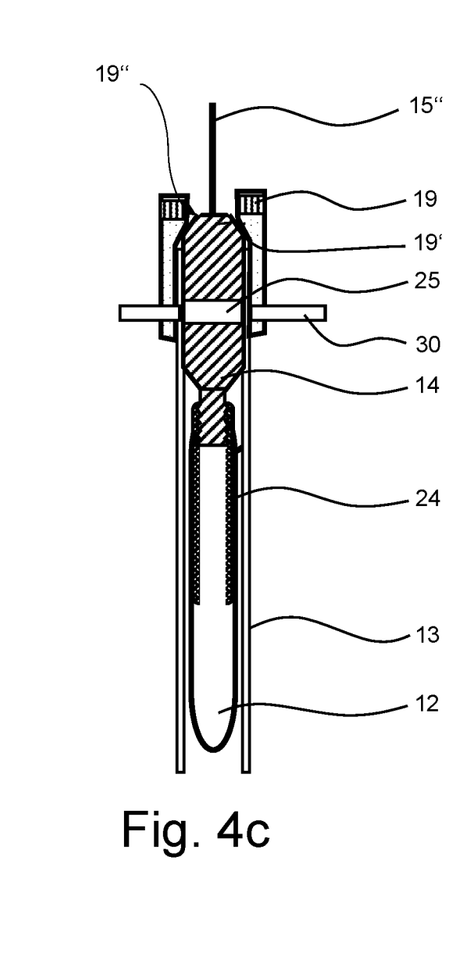
FIG. 4c shows a third schematic vertical cross section through an embodiment of the transfer device according to the invention with a detector element and end stop facilities for the shuttle assembly.

In FIGS. 4a to 4c, various embodiments of the transfer device according to the invention are shown, each having end stop facilities 19 for the shuttle assembly 14.

The end stop 19 is vibration damping in high field position and comprises abutment surfaces 19', 19" between the shuttle assembly 14 and a protrusion at the end of the guide tube 13. The abutment surfaces 19', 19" are chamfered for centering the NMR sample container 12 in the field of view when the shuttle assembly 14 is in its end stop position.

The abutment surface 19' arranged in the guide tube 13 is helpful to precisely position the shuttle assembly 14. By using a stepper motor or a servo motor the distance between the upper and the lower measuring positions can be recorded or determined to adjust the number of steps that the motor performs between both positions.

As can be seen in FIGS. 4a-c, the shuttle assembly 14 is provided with several projections that serve as abutment surfaces to position the shuttle in an exact end stop position in the high field range of the magnet. As a counterpart, a holder with a circumferential, preferably beveled end stop is arranged below the guide tube 13, on which the shuttle rests when the NMR sample container 12 is in the measuring position. The holder is fixedly arranged at the lower end of the guide tube 13. The NMR sample container 12 with the sample protrudes from the holder into the homogeneous area of the magnet (FOV).

The shuttle is designed in such a way that it fits into a standardized NMR sample container 12 with a diameter of 5 mm, with at least two O-rings 28 to provide a tight compression fitting to the NMR sample container 12.

Alternatively, holding elements 24 can be attached or glued to the NMR sample container 12, the holding elements 24 comprising for example a screw thread to which the shuttle can be screwed.

A detector element 30 is arranged to measure the exact end stop position of the shuttle assembly 14 in the magnetic fields, to ensure that the sample container 12 is precisely positioned in the homogenous B0 field in the lower position. A light barrier or a photo sensor transmitting light through the guide tube 13, when the shuttle assembly 14 is in its correct end stop position in the B0 field.

Furthermore, the shuttle assembly 14 may have a transparent area (e.g., the window 25 as depicted in FIG. 4c) through which the end position is detected by means of light guides positioned in the holder. The light guides are connected to a photo sensor. This sensor technology using photo sensors makes it possible to trigger the measurement via an interface in the operating software as soon as the shuttle has arrived at the measuring position. This feature allows the execution of very fast measuring cycles.

Figure 5:
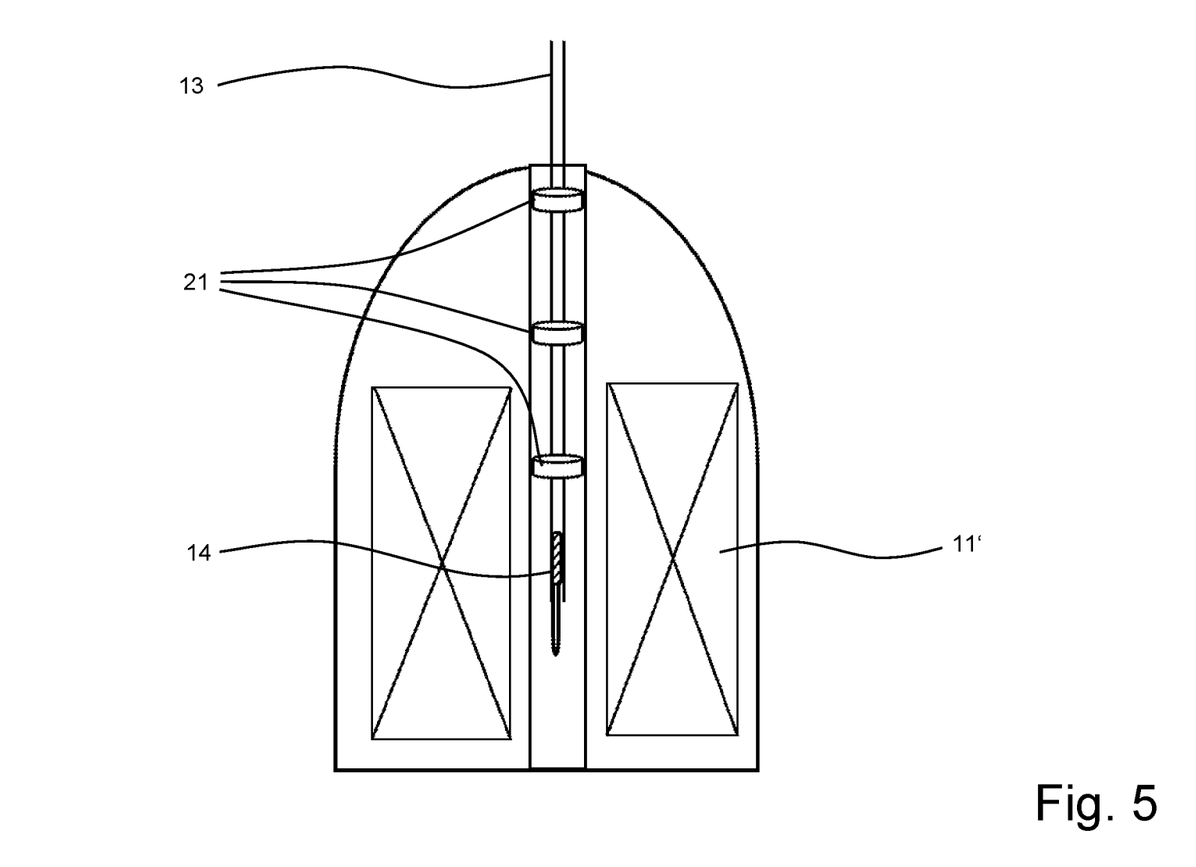
FIG. 5 shows a schematic vertical cross section through a high field NMR magnet system with a guide tube, a shuttle assembly and dampening brackets of the transfer device inside the magnet bore.

The schematic vertical cross section through a high field NMR magnet system 11' shown in FIG. 5 illustrates essential parts of the transfer device according to the invention, which are partly arranged inside the magnet bore.

The guide tube 13 is radially fixed by bumper fastenings or dampening brackets 21, which retain the guide tube inside the magnet bore and reduce significantly the vibrations and consequently also the friction and the wear of the system. Thereby the maximum radial vibration amplitude can be constrained to less than the air gap dimension.

Figure 6A:
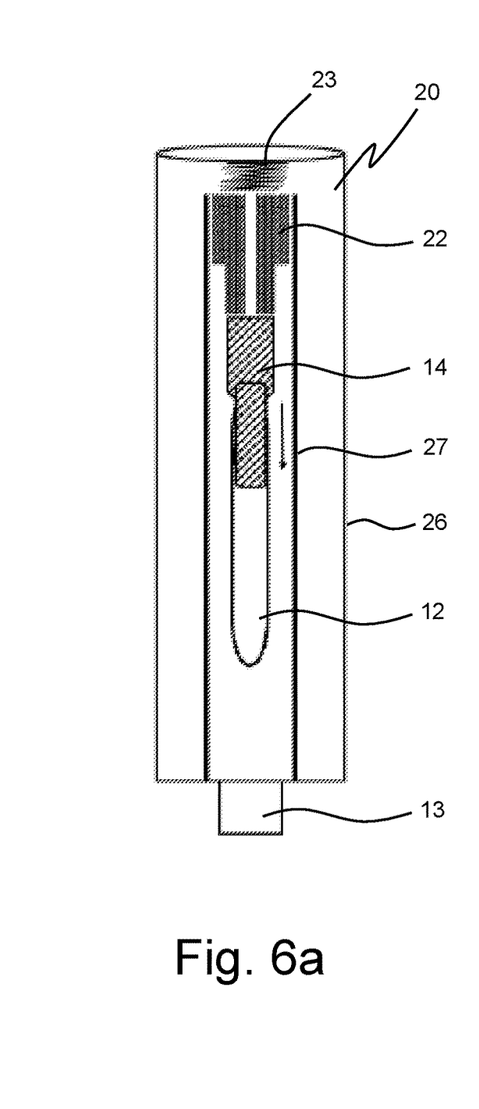
FIG. 6a shows a schematic vertical cross section through an embodiment of the exchange station in an upper position of the shuttle for opening.
Figure 6B:
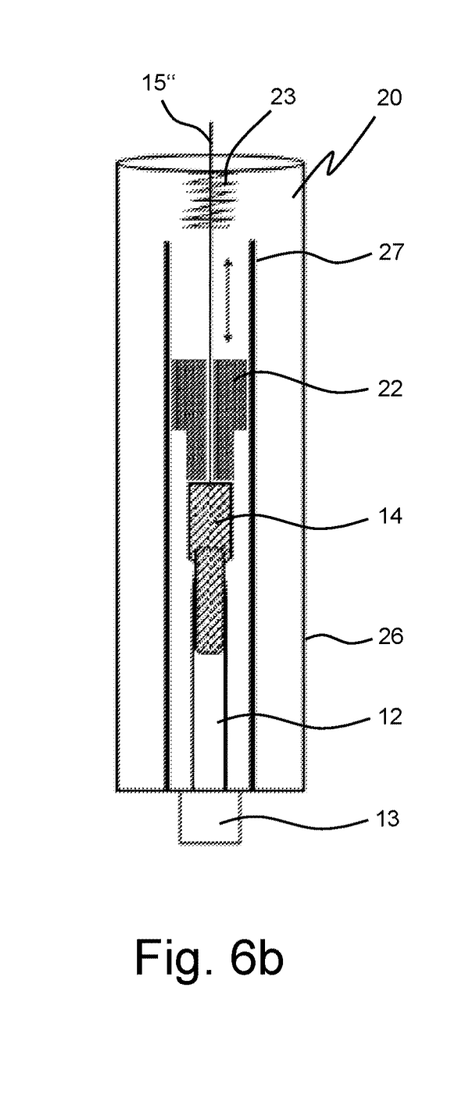
FIG. 6b shows a schematic vertical cross section through an embodiment of the exchange station in an intermediate position of the shuttle.
Figure 6C:
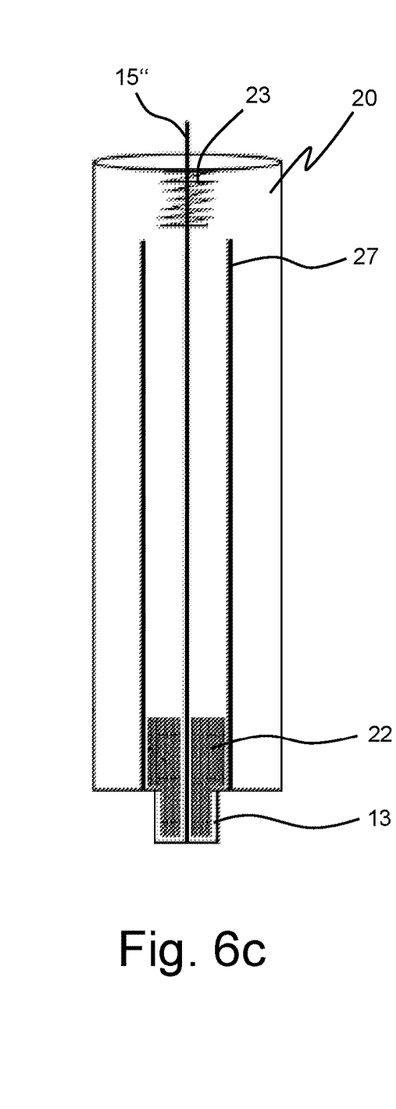
FIG. 6c shows a schematic vertical cross section through an embodiment of the exchange station in a closed position.

FIGS. 6a to 6c show schematic vertical cross sections through embodiments of the exchange station 20, namely (a) in an upper position of the shuttle for opening, (b) in an intermediate position of the shuttle, and (c) in a closed position.

The changing station 20 is located at the upper end of the guide tube 13. Instead of a window 25 (as shown in FIG. 4c), the gas-tight exchange station 20 can comprise a door or a movable sleeve 26 (as shown in FIGS. 6a and 6b) to access the shuttle assembly 14. This sleeve tube can be moved in the Z-direction and in a first position encloses the guide tube 13 in a gas-tight manner. The sleeve tube can be pushed into a second position, which gives access to the NMR sample container 12. In the area of the changing station 20, the guide tube 13 is designed to be half-open or extended by a semicircular guide so that the NMR sample container 12 can easily be removed.

It is also important that the shuttle assembly 14 is well centralized inside the guiding tube 13. For this purpose, a centering device 22 is arranged on the upper end of the guide tube 13 for aligning the winch cord 15" inside the guide tube 13 as shown in FIG. 6c. In the embodiment of FIGS. 6 a-c, the centering device 22 is movable from the lower position in which the centering device is arranged in the guide tube 13. In this embodiment, the centering device is combined with a weight element for keeping the rope under tension when the shuttle assembly 14 travels inside the changing station 20 from the lower to the uppermost position where the resilient element (here spring 23) is arranged. The weight element is engaged to guide rails 27 for allowing a controlled movement of the shuttle assembly together with the centering device 22 and for a precise re-insertion of the centering device 22 inside the guide tube 13 after the NMR sample container 12 has been changed. The main function of the centering device 22 is to perfectly axially center the rope in guide tube 13. There is no tilting moment of the shuttle due to non-axial rope force. This also prevents vibration, wear and free swing of the NMR sample container end protruding into the probehead.

The centering device 22 can also be attached separately from the weight element (not shown in FIGS. 6a-6c) to the upper end of the guide tube 13 at the lower end of the exchange station. The centering device 22 also prevents vibration excitation at the guide tube 13 due to the fast movement of the shuttle assembly 14.

A stop for the shuttle assembly 14 is attached to the upper part of the guide tube 13, which is preferably pre-tensioned by a spring 23, so that the cord 15" remains under tension while the gas flow is interrupted.

Guide rails 27 arranged within the exchange station 20 may also help to centralize the shuttle assembly 14 inside the guiding tube 13.

The invention claimed is:

1. A transfer device for shuttling a nuclear magnetic resonance (NMR) sample container between at least two coaxially arranged NMR magnet systems of an NMR spectrometer, the transfer device comprising:
    a guide tube configured to be positioned in a central bore of the coaxial magnet systems;
    a shuttle assembly being arranged inside the guide tube for securely holding and shuttling the NMR sample container;
    a drive system comprising a pulling drive and a winch cord being attached to the drive system on one side and to the shuttle assembly on the other side, such that the shuttle assembly travels inside the guide tube between the coaxial magnet systems;
    a gas-tight body above the shuttle assembly; and
    a pneumatic pressurizing arrangement with an entry for pressurized gas arranged on the gas-tight body for maintaining the winch cord under tension, wherein the shuttle assembly comprises a piston being moveable along the common axis of the coaxial magnet systems under the influence of the pressurized gas.

2. The transfer device according to claim 1, wherein an air gap is provided between the shuttle assembly piston and an inner wall of the guide tube.

3. The transfer device according to claim 2, wherein the air gap ranges from 10 μm to 50 μm.

4. The transfer device according to claim 1, wherein the pulling drive of the drive system comprises a cable winch equipped with a rotating mechanism.

5. The transfer device according to claim 4, wherein the rotating mechanism is driven by a servo motor or a stepper motor.

6. The transfer device according to claim 5, wherein the servo motor or stepper motor is calibrated for a number of steps being performed between two measuring positions within the NMR magnet systems, a distance between the two measuring positions being recorded by determining an appropriate number of steps.

7. The transfer device according to claim 1, further comprising an end stop that provides vibration damping in a high field position and that comprises an abutment surface between the shuttle assembly and a protrusion at an end of the guide tube.

8. The transfer device according to claim 7, wherein the abutment surface is chamfered for centering the NMR sample container in the high field position.

9. The transfer device according to claim 1, further comprising a detector element arranged to measure the position of the shuttle assembly in the magnetic fields.

10. The transfer device according to claim 9, wherein the detector element comprises a light barrier transmitting light through the guide tube when the shuttle assembly is in an end stop position.

11. The transfer device according to claim 1, further comprising a gas-tight exchange station having a window, a movable sleeve or a door for providing access to the shuttle assembly.

12. The transfer device according to claim 1, wherein the guide tube is radially fixed by bumper fastenings or dampening brackets that constrain a maximum radial vibration amplitude to less than an air gap dimension.

13. The transfer device according to claim 1, further comprising a centering device arranged on an upper end of the guide tube for aligning the winch cord inside the guide tube.

14. The transfer device according to claim 1, wherein a diameter of the guide tube is from 3 mm to 15 mm.

15. A nuclear magnetic resonance (NMR) spectrometer configured to perform field-cycling techniques including two-field NMR and having at least two coaxially arranged NMR magnet systems for generating different magnetic fields, wherein the spectrometer comprises a transfer device according to claim 1.

* * * * *